United States Patent
McDonald, II et al.

(10) Patent No.: US 6,794,945 B2
(45) Date of Patent: Sep. 21, 2004

(54) PLL FOR CLOCK RECOVERY WITH INITIALIZATION SEQUENCE

(75) Inventors: James J. McDonald, II, Gorham, ME (US); Ronald B. Hulfachor, Nashua, NH (US); Jim Wunderlich, Cape Elizabeth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/412,448

(22) Filed: Apr. 11, 2003

(65) Prior Publication Data

US 2003/0193374 A1 Oct. 16, 2003

Related U.S. Application Data

(60) Provisional application No. 60/371,847, filed on Apr. 11, 2002.

(51) Int. Cl.$^7$ ................................................. H03L 7/06
(52) U.S. Cl. ...................... 331/1 A; 327/156; 375/375
(58) Field of Search ............................. 331/1 A, 17, 18, 331/100; 327/3, 7, 8, 9, 24, 156, 159, 376; 375/375, 376

(56) References Cited

U.S. PATENT DOCUMENTS

| | | | | |
|---|---|---|---|---|
| 4,371,975 A | * | 2/1983 | Dugan | .................. 375/376 |
| 6,072,344 A | * | 6/2000 | Larsson | .................. 327/156 |
| 6,628,171 B1 | * | 9/2003 | Chou et al. | .................. 331/1 A |

* cited by examiner

*Primary Examiner*—Robert Pascal
*Assistant Examiner*—Joseph Chang
(74) *Attorney, Agent, or Firm*—Cesari and McKenna, LLP; Edwin H. Paul, Esq.

(57) ABSTRACT

A phase locked loop circuit is used to provide timing clocks for data bit recovery from a serial data flow. The system locks to a SYNC signal, preferably a lower frequency fifty percent duty cycle square wave with a period equal to the time of a fully framed serial data word. When a start signal transition is detected the system is prevented from trying to lock onto the data signal edge transitions. But, the system provides a signal suitable for clocking in the individual data bits.

16 Claims, 3 Drawing Sheets

PLL FOR CLOCK RECOVERY WITH INITIALIZATION SEQUENCE

CROSS-REFERENCE TO RELATED APPLICATIONS

The present application claims the benefit of U.S. Provisional Patent Application Serial No. 60/371,847, which was filed on Apr. 11, 2002, of common inventorship, title and ownership as the present application, and which provisional application is hereby incorporated herein by reference.

BACKGROUND OF THE INVENTION

1. Field of the Invention

The present invention relates to circuits for reliably sending and receiving non-return-to-zero (NRZ) serial data strings using, for example, phase locked loop (PLL) circuits for deriving clock pulses for sampling the NRZ serial data received.

2. Background Information

Sending a data word serially, that is as a bit stream over a single channel or wire, the receiver must be able to distinguish the beginning of the word and the timing for each individual bit. Framing bits have been devised to indicate the beginning and the end of data words (asynchronous transfers), or means without framing bits to synchronize (synchronized) the sender and receiver to the beginning and end of data words are well known in the art. The problem of determining where the individual bit are in time, as is well known in the field, is more difficult when the bit stream is sent as NRZ. In an NRZ bit stream, if the data word being sent has all one's or zero's, the physical signal is a constant level with no indication of where bit boundaries exist. In such a case there is a need for the receiver system to determine where the individual bits are so that the serial stream can be successfully received.

This sending and receiving of digital data words (or bytes) via a bit stream, in modern system, usually requires converting a parallel data word into a serial form, sending and receiving the serial form, and converting the serial data bits back into a parallel data word. There have been many techniques used to accomplish this task.

One such technique is illustrated in U.S. Pat. No. 4,371,975 ('975) to John M. Dugan. This patent describes an oversampling technique running a clock much faster that the fastest received data rate. Presumably the fastest data rate would occur sending a data word of alternating zero's and one's. In oversampling the resolution of finding the individual bit time locations is a function of the faster clock rate, so the faster the better the ability of finding correct bit locations, but faster clocks will dissipate more power primarily by driving more current through the capacitances involved. And, as the serial data rates and thus the clock rates increase these problems increase.

The linearity of the receiver is also affected by the faster clock rate, where better linearity occurs with faster clock rates, but again at the expense of higher power dissipation.

Another techniques is found in U.S. Pat. No. 6,072,344 ('344) to Larsson. This patent describes comparing phases of input data to a voltage controlled oscillator (VCO). The system locks the VCO to the data rate to provide a clock for receiving the data. This techniques requires a faster clock, but usually not as fast as that described for the over sampling system, but this technique locks slowly, taking tens of microseconds or more.

An objective of the present invention is to provide a system to generate timing signals that accurately determine received bit time positions from a serial data stream without requiring an excessively fast clock while still providing a reasonable locking time.

SUMMARY OF THE INVENTION

The present invention provides a system that generates timing signals that may be used to recover data and framing bits from a serial bit steam while providing a clock with a frequency substantially lower than the bit rate. The inventive system provides a SYNC square wave signal with a period about equal to the word length of the sent data and framing bits. Preferably a phase detector, a charge pump and signal conditioning filters provide a control signal (an up and/or down or error signal) to a voltage controlled oscillation (VCO). An output from the VCO is fed back to the phase detector input for comparing to the SYNC signal, whereupon the system phase locks these two signals. A lock signal is sent to the serial data sending system, whereupon the data sender system may then send framed serial random data signals. In a preferred embodiment, the serial data word sent always begins with a rising edge and ends with a zero.

The VCO provides as many phase shifted outputs as there are random data and framing bits in the word sent. The phase shifted VCO outputs define the bit positions in the serial word sent.

Preferably a reset signal is generated that disables the feedback phase locking loop by holding the control signal so that the VCO phase output signals cannot change. This disabling occurs when random data signals are being received and so prevents the phase locked loop from locking to the data signal. The reset signal enables the phase locking only during the time when the stop bit/start edge occurs.

In a preferred embodiment of the present invention there is no clock generated that has a period shorter than the framed data word being sent. So the fastest clock is typically at least an order of magnitude frequency lower than the random data bit rate.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
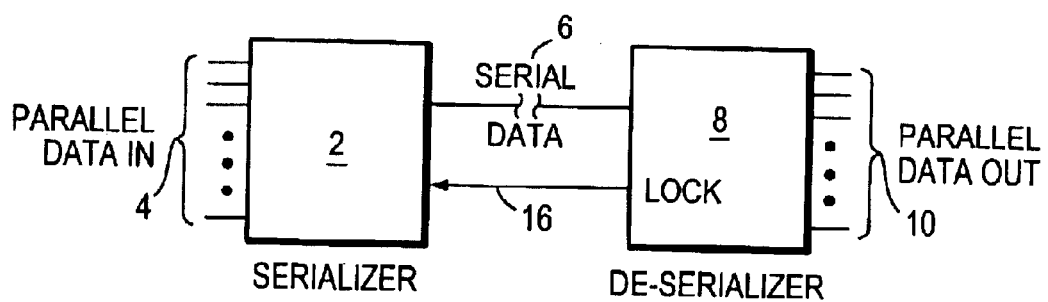
FIG. 1 is system block diagram of a communication system.

FIG. 1 shows an overview block diagram of a serializer 2 that inputs a parallel data word 4, and outputs 6 the data word serially to a de-serializer 8 that reconstitutes the data word in parallel 10. In a preferred embodiment the input data word is ten bits wide, but the serialized data stream adds start and stop bits. The serial stream includes a one, as a start bit, ten data bits, and ends with a zero stop bit. So for each ten bit data word twelve bits are sent. In this preferred embodiment, there is a zero to one, start, transition always at the beginning of a word being sent and the stop bit is a zero. A LOCK signal 16 is provided back to the serializer/sender that indicates when the de-serializer is locked and ready to receive random data bits.

As discussed above the receiver de-serializer must decode or know when a word is being sent. This is accomplished by the receiver sensing the zero to one transition of the start bit and not a data transition from the ten bit data word. The receiver also generates a clock signal that is synchronized and locked to a reference signal, the SYNC, and will provide a clock transition for each individual data bit time location so those data bits can be properly received.

Figure 2:
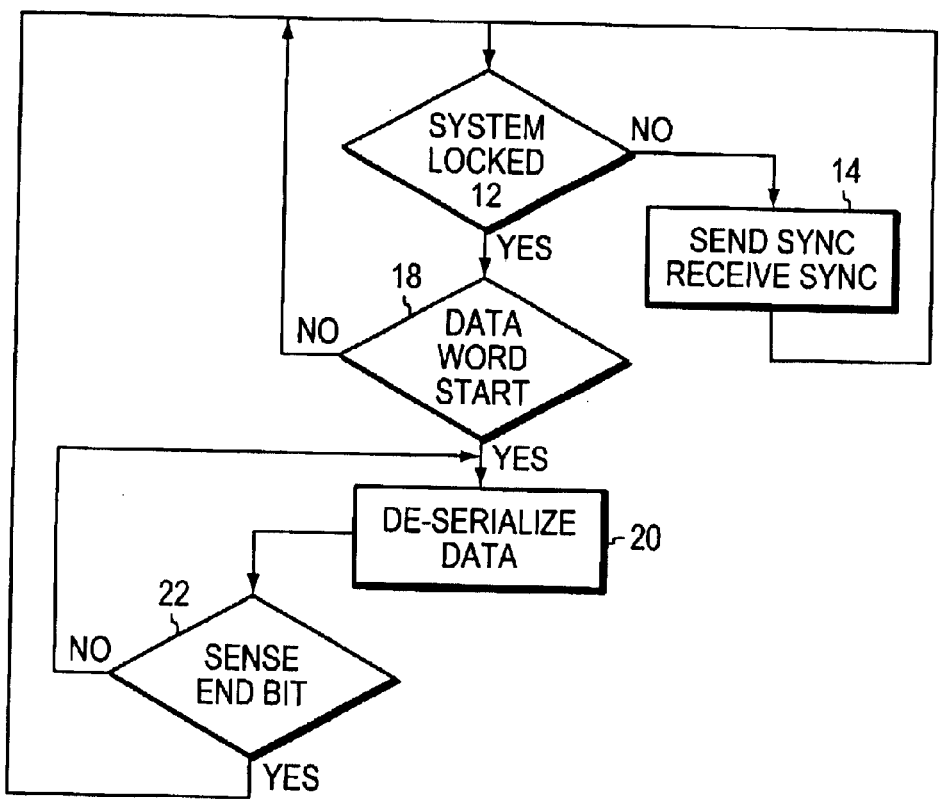
FIG. 2 is a system flow chart.

FIG. 2 shows a flow chart of the system receiving data. If the system is not locked 12, the serializer sends out SYNC signals 14 to the de-serializer receiver. The receiver locks to the SYNC signal and conveys this LOCK status to the sender (16 of FIG. 1). Now the system is locked and awaits the zero to one start bit 18. When the start arrives the next bits of the data word are de-serialized 20 and stored. The receiver continues to de-serialize the data word bits until the end bit arrives 22. In this embodiment the receiver is programmed to know that ten data bits are to be received. However, in other systems preamble and other such information may be passed between the systems such that the receiver and the sender may transfer a variety of data bit widths. When the stop bit occurs, the system reverts to looking for the start bit 18. However, if the system becomes unlocked 12 the SYNC signal is re-sent out to re-establish synchronization between the sender and receiver. The system may be come unlocked or un-synchronized if no data words are sent for some a time period.

Figure 3:
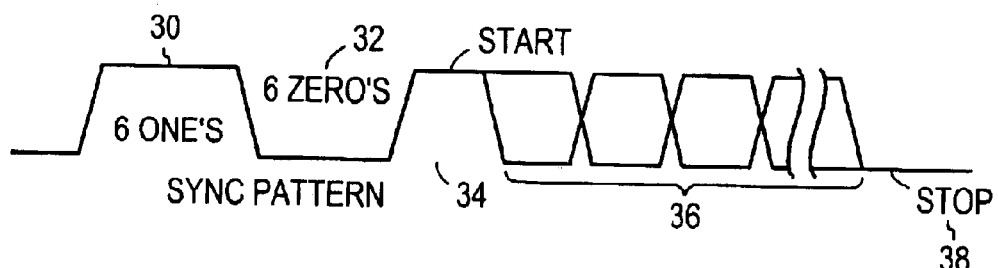
FIG. 3 is a signal timing chart of the serial signals being sent.

FIG. 3 shows a synchronizing pattern. Here a SYNC pattern consists of six one's followed by six zero's 32. If the receiver is locked, DATA IN start bit 34 is received and the de-serializer receiver will clock in the ten data bits 36 and detect the zero stop bit 38. Notice that if the last data bit is a one there will be a transition one to zero at the stop bit, but if the last data bit is a zero there will be no transition, the zero level will simply remain during the STOP bit time—the twelfth bit time position. In a preferred embodiment the SYNC forms a symmetric square wave at a frequency from about forty to about sixty-six megahertz, or about an order of magnitude less than the data bit rate. But other frequencies may be used.

Figure 4:
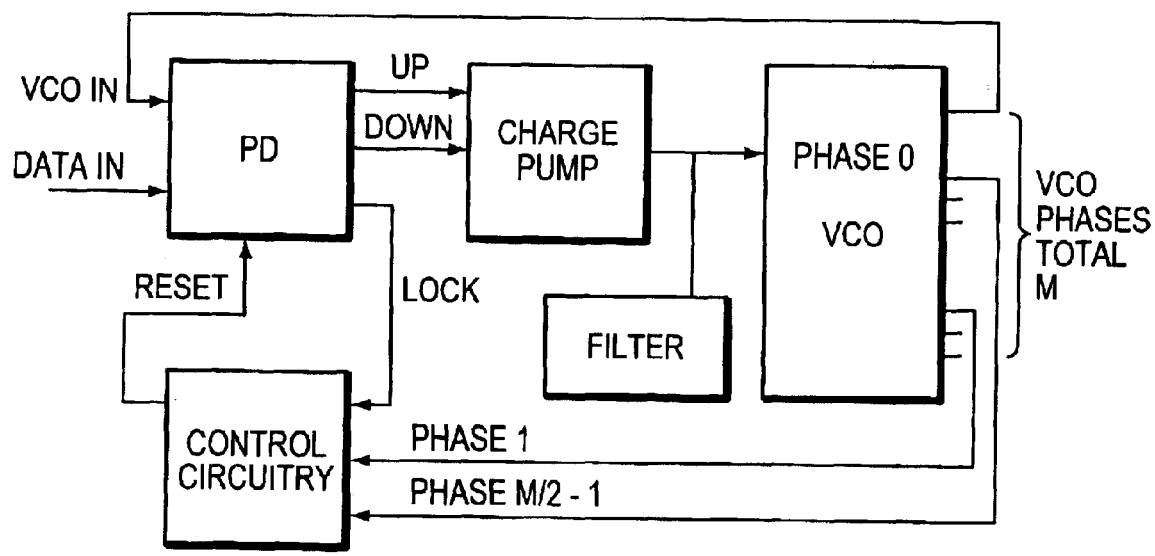
FIG. 4 is a circuit schematic of a PLL circuitry at the de-serializer receiver.

FIG. 4 is a schematic of a three-state phase detector that is designed and constructed to ignore the random data transition edges (random because the data content can be any of the possible binary combinations). These data bit edges cause problems in the prior art circuits. The VCO provides a set of output signals with M phases. That is each of the M outputs is phase shifted from each other. In this preferred embodiment M is equal to the number of data and framing bits in a word. So for the above example M is 12 bits, and 12 phase shifted outputs are provided by the VCO. One output is at zero phase and each of the remaining eleven are delayed by 30 degrees. Each of these twelve phase output are used to clock one of the twelve bits of data and framing into the de-serializer. The control circuitry is designed to accept particular phase shifted outputs from the VCO and the LOCK signal from the phase detector to logically form a RESET signal that prevents the phase detector and the VCO from responding to the data bit edges.

Still referring to FIG. 4, when LOCK is true, the receiver is locked to the SYNC signal. In this case the rising edge of VCO IN and the DATA IN signal are phase locked with each other. The combination of the PD, charge pump, filter and VCO form a phase locked loop. The Phase 1 and Phase M/2-1 signals are selected to create the RESET signal, that, when true, prevents the VCO outputs from changing and locking onto the data signals.

In the illustrative examples, ten data bits, a start and a stop bit are used so that M would be 12. In this case M/2-1 is 12/2-1 or VCO phase 5 and VCO phase 1 are input to the control circuitry where these signals are OR'ed to output the RESET signal. As mentioned above, a logical true RESET signal prevents the VCO from changing and thereby locking erroneously onto the data bit signals. However, the phase inputs to the control circuitry force RESET false for a short time, called a window, and allows the phase locked loop to lock the start edges of the bit stream to the phase zero output of the VCO. The phase detector, charge pump, filter and the VCO are circuit modules well known in the art. When the LOCK signal is false, the RESET signal is held false and not used. In this case the sender reads the false LOCK signal and issues SYNC signals until the SYNC and phase zero signals are locked. In this instance the SYNC signal is a symmetric square wave, see FIG. 3, with a period equal to the twelve bit times. The sender will send data only when the LOCK signal is true.

Still referring to FIG. 4, the other VCO output phases provide, when locked, signals from which the individual data bits may be clocked into registers (not shown). The M bits sent match the number of phase outputs from the VCO.

Figure 5:
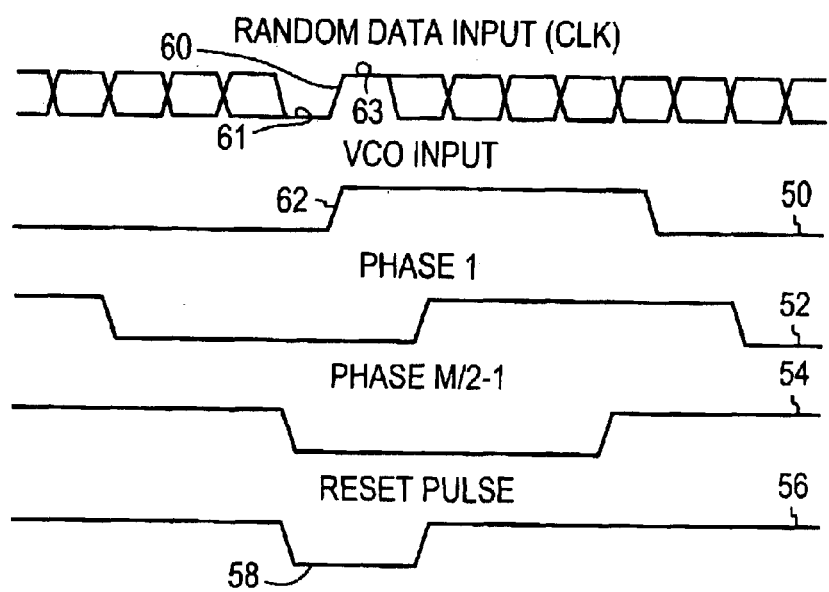
FIG. 5 is a signal timing chart showing the relationship of the major control signals in a preferred embodiment.

FIG. 5 is a general signal chart indicating the relationship of the signals found in the circuit of FIG. 4 for a twelve data and framing bit word. Here the RESET pulse 56 is true (high) when either PHASE 1 or PHASE 5 (M/2-1) is true (high). During this time the VCO phase shifted outputs do not change. In this particular embodiment PHASE 1 is a thirty (30) degree delay and PHASE 5 is a one hundred and fifty (150) degree delay. Notice that when the RESET is low 58 only when the DATA IN is low during a stop bit 61 and during the first or start bit 63. Only during this time is the PLL (the PD to VCO feed back loop) enabled to lock. The locking will only be active for the stop/start bits. When there is no LOCK, the sender reads the no LOCK and responds by sending SYNC signals to the phase detector. The system will then lock onto the SYNC signal and be ready to receive data word. Only the frame stop bit and start edge will be allowed to reach the VCO, but not the data edges.

Figure 6:
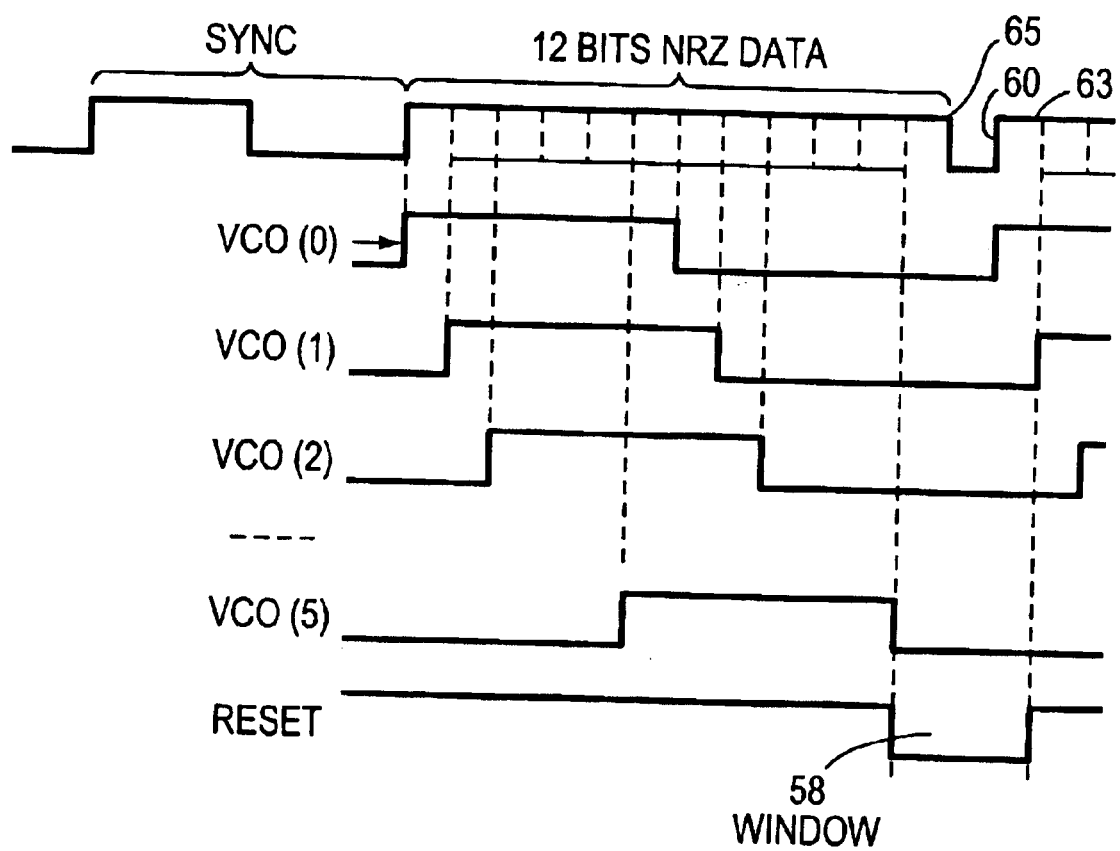
FIG. 6 is a more detailed signal timing charts of the signal found in the circuitry of FIG. 4.

FIG. 6 shows the traces of FIG. 5 in more detail with additional VCO outputs and the full number of bits for the 12 bit illustrative example. Window 58 shows the RESET going low (false) only when both VCO(1) and VCO(5) are low. At this time the PLL is enabled to lock onto the edge of the bit stream. The window is open one phase or bit time 65 before the stop bit/start edge until one bit time 63 after the start edge. Only during this window the UP/DOWN signals from the phase compartors are allowed to affect the VCO via the charge pump and the filter, as mentioned above, only during this time is the PLL enabled to lock the VCO phase zero rising edge to the DATA IN rising edge.

The specific electronic circuitry to implement the present invention and variations thereof is well known in the art, including the phase comparator, the charge pump, the filter, the VCO with the multiple phase shifted outputs, and the logic control circuit. Examples may be found in electronics texts, data catalogues from many suppliers and prior U.S. patents.

Of course, other embodiments, including, when no data is being sent, having the sender randomly sending SYNC pulses to maintain lock can be used to advantage with the present invention.

What is claimed is:

1. A system for generating de-serializing timing signals for a serial bit stream word of M bits including data and framing bits, the system comprising:

a voltage controlled oscillator with a number of outputs equal to M, wherein the outputs are equally offset from each other in phase over the period of about M bits, wherein each phase in succession about matches the corresponding successive bits in the bit stream, a phase detector arranged to receive the serial bit stream word and a phase output from the voltage controlled oscillator, wherein the phase detector compares the serial bit stream word to the voltage controlled oscillator phase output, a control signal output from the phase detector, wherein the control signal indicates whether the voltage control oscillator phase output must go faster or slower, and wherein the voltage controlled oscillator output, in response to the control signal, becomes phase locked to the serial bit stream word, a reset signal input to the phase detector, wherein when the reset signal is true the control signal is disabled and when the rest signal is false the control signal is enabled, circuitry receiving a combination of voltage controlled oscillator phase outputs and logically forming the reset signal therefrom, wherein the reset signal is false for the last of the M bits to the beginning of the second of the M bits, thereby defining a time window where the control signal is active.

2. The system of claim 1 further comprising a lock signal, generated by the phase detector and input to the control circuitry and to a data sender system, wherein the lock signal is true when the phase detector has phase locked a voltage controlled phase signal to the bit stream signal, and when the lock signal is false, indicating that the voltage controlled phase signal is not locked to the bit stream signal.

3. The system of claim 2 further comprising, in response to a false LOCK signal, means for defining and sending a bit stream SYNC word to the phase detector.

4. The system of claim 3 wherein the SYNC word comprises a substantially symmetrical square wave signal with a period about equal to M bit.

5. The system of claim 3 further comprising means for driving the LOCK signal true only during the framing bits.

6. The system of claim 1 wherein M comprises at least one start bit and one stop bit framing a plurality of data bits.

7. The system of claim 1 wherein the control signal comprises an UP signal and a DOWN signal.

8. The system of claim 1 further comprising a charge pump and a filter, wherein the control signal travels from the phase detector to the charge pump, then to a filter and then to the voltage controlled oscillator.

9. A method for generating de-serializing timing signals for a serial bit stream word of M bits including data and framing bits, the method comprising the steps of:

providing a voltage controlled oscillator outputting a number of phase outputs equal to M, wherein the outputs are equally offset from each other in phase over the period of about M bits, wherein each phase in succession about matches the corresponding successive bits in the bit stream, phase comparing the serial bit stream word and a phase output, producing a control signal output from the phase comparing, wherein the control signal indicates whether the oscillator must go faster or slower, and wherein the oscillator output in response to the control signal becomes phase locked the serial bit stream word, opening a time window during which the control signal is enabled, and when the control signal is disabled the oscillator output is not responsive to the control signal, combining phase outputs and logically forming the time window therefrom, wherein the time window is open for the last of the M bits to the beginning of the second of the M bits of the serial bit word.

10. The method of claim 9 further comprising the steps of:

generating a lock signal from the phase detecting, sending the lock signal to a data sender system, wherein the lock signal is true when the phase detector has phase locked oscillator to the bit stream signal, and when the lock signal is false, indicating that the voltage controlled phase signal is not locked to the bit stream signal.

11. The method of claim 10 further comprising the step of defining and sending, in response to a false LOCK signal, a bit stream synchronizing SYNC word to the phase detector.

12. The method of claim 11 wherein the defining of the SYNC word comprises the step of forming a substantially symmetrical square wave signal with a period about equal to M bit.

13. The method of claim 11 further comprising the step of driving the LOCK signal true only during the framing bits.

14. The system of claim 9 wherein M comprises the step of forming at least one start bit and one stop bit framing a plurality of data bits.

15. The method of claim 9 wherein the controlling comprises the step of forming an UP signal and a DOWN signal.

16. The method of claim 9 wherein the step of producing a control signal comprises the steps of forming a charge pump and forming a filter, wherein the control signal travels from the phase detector into the charge pump, then into a filter and then into the voltage controlled oscillator.

* * * * *